US012772482B2

(12) United States Patent
Cheng

(10) Patent No.: US 12,772,482 B2
(45) Date of Patent: Oct. 20, 2026

(54) SEMICONDUCTOR STRUCTURE AND MANUFACTURING METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 436 days.

(21) Appl. No.: 18/415,463

(22) Filed: Jan. 17, 2024

(65) Prior Publication Data

US 2025/0126826 A1 Apr. 17, 2025

(30) Foreign Application Priority Data

Oct. 13, 2023 (CN) ......................... 202311330824.0

(51) Int. Cl.

*H10D 30/01* (2025.01)
*H10D 30/47* (2025.01)
*H10D 62/10* (2025.01)
*H10D 62/85* (2025.01)
*H10P 14/20* (2026.01)

(52) U.S. Cl.

CPC ......... *H10D 30/475* (2025.01); *H10D 30/015* (2025.01); *H10D 62/124* (2025.01); *H10D 62/8503* (2025.01); *H10P 14/3416* (2026.01)

(58) Field of Classification Search

CPC .. H10D 30/015; H10D 30/475; H10D 62/124; H10D 62/343; H10D 62/8503; H10P 14/3416

See application file for complete search history.

(56) References Cited

U.S. PATENT DOCUMENTS 12,684,800 B2 * 7/2026 Cheng .................. H10D 30/475
2006/0189019 A1 * 8/2006 Lee ......................... C30B 25/02 257/E21.113
2010/0133658 A1 * 6/2010 Dadgar ................... C30B 25/02 438/681
2012/0161287 A1 * 6/2012 Iza ........................ C30B 23/025 117/90

(Continued)

FOREIGN PATENT DOCUMENTS

WO WO-2021208576 A1 * 10/2021 ............. H10D 64/20
WO WO-2021208577 A1 * 10/2021 ............. H10D 64/20

(Continued)

*Primary Examiner* — Telly D Green
(74) *Attorney, Agent, or Firm* — Westbridge IP LLC

(57) ABSTRACT

A semiconductor structure includes a substrate, a nucleation layer, a buffer layer and a heterojunction structure layer that are stacked sequentially. The nucleation layer includes a first nucleation layer and a second nucleation layer. The first nucleation layer includes a plurality of strip-shaped structures, a strip-shaped trench is formed between two adjacent strip-shaped structures in the plurality of strip-shaped structures, and an extension direction of the strip-shaped trench is parallel to a plane where the substrate is located. The strip-shaped trench and the first nucleation layer are covered by the second nucleation layer, and an ion penetration capability of the second nucleation layer is higher than an ion penetration capability of the first nucleation layer. The technical solutions of the present disclosure may improve a linearity of a device.

20 Claims, 8 Drawing Sheets

(56) References Cited

U.S. PATENT DOCUMENTS

| | | | | |
|---|---|---|---|---|
| 2012/0187374 | A1* | 7/2012 | Lee | H10P 14/2904 257/E29.069 |
| 2015/0349064 | A1* | 12/2015 | Azize | H10D 30/015 438/478 |
| 2019/0221648 | A1* | 7/2019 | Liu | H10D 62/824 |
| 2019/0363069 | A1* | 11/2019 | Ahmed | G09G 3/32 |
| 2020/0350162 | A1* | 11/2020 | Cheng | H10D 62/112 |
| 2020/0350426 | A1* | 11/2020 | Fang | H10D 30/015 |
| 2021/0151592 | A1* | 5/2021 | Lee | H10D 30/015 |
| 2021/0175138 | A1* | 6/2021 | Lee | H10D 30/475 |
| 2022/0068631 | A1* | 3/2022 | Chen | H10D 30/015 |
| 2022/0393003 | A1* | 12/2022 | Li | H10D 62/82 |
| 2023/0343588 | A1* | 10/2023 | Lin | H10P 14/2904 |
| 2023/0378278 | A1* | 11/2023 | Liu | H10D 62/824 |
| 2023/0387283 | A1* | 11/2023 | Cheng | H10D 30/475 |
| 2025/0126826 | A1* | 4/2025 | Cheng | H10D 30/015 |

FOREIGN PATENT DOCUMENTS

| | | | | |
|---|---|---|---|---|
| WO | WO-2022061525 | A1 * | 3/2022 | H10D 64/011 |
| WO | WO-2023241593 | A1 * | 12/2023 | H10D 62/357 |

* cited by examiner

SEMICONDUCTOR STRUCTURE AND MANUFACTURING METHOD THEREFOR

CROSS-REFERENCE TO RELATED APPLICATIONS

This present application claims priority to Chinese Patent Application No. 202311330824.0, filed on Oct. 13, 2023, which is hereby incorporated by reference in its entirety.

TECHNICAL FIELD

The present application relates to the field of semiconductor technologies, and in particular, to a semiconductor structure and a manufacturing method for the semiconductor structure.

BACKGROUND

Gallium Nitride (GaN) materials have many advantages of wide band gap, high breakdown field strength and the like, AlGaN/GaN heterojunction devices prepared based on the GaN materials have a high electron mobility, and a high-concentration of two-Dimensional Electron Gas (2DEG) may be formed at a heterojunction interface through polarization under a condition of unintentional doping, so that Gallium Nitride-based High Electron Mobility Transistor (GaN HEMT) devices have a wide application prospect in the field of microwave power. However, GaN HEMT devices face a serious nonlinear problem, which seriously restricts applications of the GaN HEMT devices in the field of communications.

SUMMARY

In view of this, embodiments of the present disclosure provide a semiconductor structure and a manufacturing method therefor to improve a linearity of a gallium nitride high electron mobility transistor device.

According to an aspect of the present disclosure, an embodiment of the present disclosure provides a semiconductor structure, which includes: a substrate, a nucleation layer, a buffer layer and a heterojunction structure layer that are stacked sequentially. The nucleation layer includes a first nucleation layer and a second nucleation layer, the first nucleation layer includes a plurality of strip-shaped structures, a strip-shaped trench is formed between two adjacent strip-shaped structures in the plurality of strip-shaped structures, an extension direction of the strip-shaped trench is parallel to a plane where the substrate is located, the strip-shaped trench and the first nucleation layer are covered by the second nucleation layer, and an ion penetration capability of the second nucleation layer is higher than an ion penetration capability of the first nucleation layer.

As an optional embodiment, a thickness of the second nucleation layer is less than a thickness of the first nucleation layer.

As an optional embodiment, a thickness of the second nucleation layer is less than 100 nm.

As an optional embodiment, a material of the first nucleation layer includes $Al_{a1}In_{b1}Ga_{1-a1-b1}N$, where $0 \le a1 \le 1$, $0 \le b1 \le 1$ and $0 \le 1-a1-b1 \le 1$; and a material of the second nucleation layer includes $Al_{a2}In_{b2}Ga_{1-a2-b2}N$, where $0 \le a2 \le 1$, $0 \le b2 \le 1$ and $0 \le 1-a2-b2 \le 1$.

As an optional embodiment, an Al component content of the second nucleation layer is less than an Al component content of the first nucleation layer.

As an optional embodiment, a plurality of strip-shaped trenches are formed in the first nucleation layer, and at least two strip-shaped trenches in the plurality of strip-shaped trenches have different widths, and/or at least two strip-shaped trenches in the plurality of strip-shaped trenches have different spacing distances.

As an optional embodiment, the buffer layer includes a first buffer layer and a second buffer layer, the first buffer layer is corresponding to the first nucleation layer, the second buffer layer is corresponding to the strip-shaped trench, and an n-type ion doping concentration of the second buffer layer is higher than an n-type ion doping concentration of the first buffer layer.

As an optional embodiment, a surface of a side, away from the substrate, of the buffer layer is a plane.

As an optional embodiment, the buffer layer is conformally disposed on the nucleation layer.

As an optional embodiment, an n-type ion doping concentration of the buffer layer is gradually decreased along a direction away from the substrate.

As an optional embodiment, a material of the substrate includes at least one of silicon and silicon carbide.

As an optional embodiment, an n-type ion in the buffer layer is a silicon ion.

As an optional embodiment, the semiconductor structure further includes:

- a source and a drain, located on the heterojunction structure layer, where a direction from the source to the drain is parallel to the extension direction of the strip-shaped trench;
- a gate, located on the heterojunction structure layer and between the source and the drain; and
- a dielectric layer, located on a side, close to the heterojunction structure layer, of the gate.

According to another aspect of the present disclosure, an embodiment of the present disclosure provides a manufacturing method for a semiconductor structure, which includes:

- growing a first nucleation layer on a substrate, and etching a plurality of strip-shaped trenches in the first nucleation layer to form a plurality of strip-shaped structures, where an extension direction of each strip-shaped trench in the plurality of strip-shaped trenches is parallel to a plane where the substrate is located;
- growing conformally a second nucleation layer in the strip-shaped trench and on the first nucleation layer, where an ion penetration capability of the second nucleation layer is higher than an ion penetration capability of the first nucleation layer;
- growing a buffer layer on the nucleation layer including the first nucleation layer and the second nucleation layer; and
- growing a heterojunction structure layer on the buffer layer.

As an optional embodiment, after the buffer layer is grown, an n-type ion in the substrate disposed below the strip-shaped trench diffuses into the buffer layer to form a second buffer layer corresponding to the strip-shaped trench and to form a first buffer layer corresponding to the first nucleation layer, and an n-type ion doping concentration of the second buffer layer is higher than an n-type ion doping concentration of the first buffer layer.

As an optional embodiment, the n-type ion for forming the second buffer layer is a silicon ion.

As an optional embodiment, the manufacturing method for the semiconductor structure further includes:

forming a dielectric layer, a source and a drain that are located on the heterojunction structure layer, and forming a gate located on the dielectric layer and between the source and the drain, where a direction from the source to the drain is parallel to the extension direction of the strip-shaped trench.

DETAILED DESCRIPTIONS OF THE EMBODIMENTS

Technical solutions in embodiments of the present disclosure are described clearly and completely below with reference to the drawings of the embodiments of the present disclosure. Apparently, the described embodiments are only a part, but not all of the embodiments of the present disclosure. All other embodiments that may be obtained by those of ordinary skill in the art based on the embodiments in the present disclosure without any inventive efforts fall into the protection scope of the present disclosure.

In order to improve a linearity of a gallium nitride high electron mobility transistor device, the present disclosure provides a semiconductor structure and a manufacturing method for the semiconductor structure. The semiconductor structure includes a substrate, a nucleation layer, a buffer layer and a heterojunction structure layer that are stacked sequentially. The nucleation layer includes a first nucleation layer and a second nucleation layer. The first nucleation layer includes a plurality of strip-shaped structures, a strip-shaped trench is formed between two adjacent strip-shaped structures in the plurality of strip-shaped structures, and an extension direction of the strip-shaped trench is parallel to a plane where the substrate is located. The strip-shaped trench and the first nucleation layer are covered by the second nucleation layer, and an ion penetration capability of the second nucleation layer is higher than an ion penetration capability of the first nucleation layer. The first nucleation layer and the second nucleation layer with different ion penetration capacities are designed in the present disclosure to enable an n-type ion (such as a silicon ion) in the substrate to diffuse into the buffer layer through the second nucleation layer, so that a first buffer layer and a second buffer layer with different n-type ion concentrations are formed in the buffer layer. Along a channel width direction, a doping concentration of the buffer layer changes, and an influence on a concentration of a two-dimensional electron gas is also changed, so that different threshold voltages may be formed at different positions of a channel layer, thereby improving the linearity of the device.

A semiconductor structure and a manufacturing method therefor, mentioned in the present disclosure, are illustrated with examples below with reference to FIG. 1 to FIG. 17.

Figure 1:
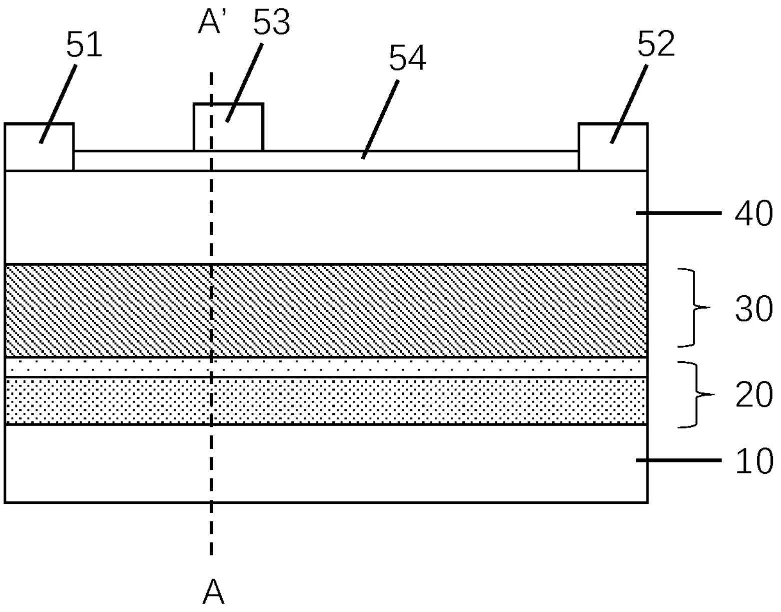
FIG. 1 is a schematic structural diagram of a semiconductor structure according to an embodiment of the present disclosure.
Figure 2:
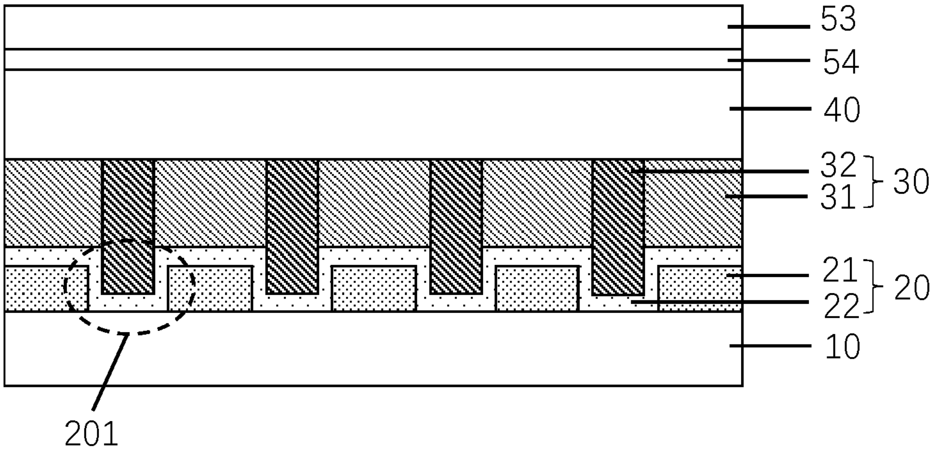
FIG. 2 is a schematic structural diagram of a semiconductor structure along the AA' cross-section in FIG. 1.

FIG. 1 is a schematic structural diagram of a semiconductor structure according to an embodiment of the present disclosure. FIG. 2 is a schematic structural diagram of a semiconductor structure along the AA' cross-section in FIG. 1. As shown in FIG. 2, the semiconductor structure includes a substrate 10, a nucleation layer 20, a buffer layer 30 and a heterojunction structure layer 40 that are stacked sequentially. The nucleation layer 20 includes a first nucleation layer 21 and a second nucleation layer 22. The first nucleation layer 21 includes a plurality of strip-shaped structures, a strip-shaped trench 201 is formed between two adjacent strip-shaped structures, and an extension direction of the strip-shaped trench 201 is parallel to a plane where the substrate 10 is located. The strip-shaped trench 201 and the first nucleation layer 21 are covered by the second nucleation layer 22, and an ion penetration capability of the second nucleation layer 22 is higher than an ion penetration capability of the first nucleation layer 21. Further, in some embodiments, the buffer layer 30 may include a first buffer layer 31 and a second buffer layer 32, the first buffer layer 31 is corresponding to the first nucleation layer 21, the second buffer layer 32 is corresponding to the strip-shaped trenches 201, and an n-type ion doping concentration of the second buffer layer 32 is higher than an n-type ion doping concentration of the first buffer layer 31. In some embodiments, as shown in FIG. 1, the semiconductor structure further includes: a source 51 and a drain 52, located on the heterojunction structure layer 40, where a direction from the source 51 to the drain 52 is parallel to the extension direction of the strip-shaped trench 201; a gate 53, located on the heterojunction structure layer 40 and between the source 51 and the drain 52; and a dielectric layer 54, located on a side, close to the heterojunction structure layer 40, of the gate 53.

In some embodiments, the substrate 10 may include n-type ions. The n-type ions may be silicon ions or other ions. When the substrate 10 includes silicon ions, a material of the substrate 10 may include at least one of silicon and silicon carbide. Further, when the substrate 10 includes n-type ions such as silicon ions, since an ion penetration capability of the second nucleation layer 22 is higher than an ion penetration capability of the first nucleation layer 21, the silicon ions in the substrate 10 may penetrate through the second nucleation layer 22 and diffuse into the buffer layer 30. The n-type ions in the buffer layer 30 are silicon ions, the buffer layer 30 of silicon-doped may release electrons, and an energy level of a semi-filled state formed by impurities and defects in the nucleation layer 20 may capture the electrons, thereby reducing capture of device electrons, enhancing device performance and improving reliability of the device. Moreover, the buffer layer 30 of silicon-doped may supplement carriers to improve a concentration of the two-dimensional electron gas and reduce a channel on-resistance. Since the n-type ions in the buffer layer 30 are diffused from the substrate 10, an n-type ion doping concentration of the buffer layer 30 is gradually decreased along a direction away from the substrate 10. The n-type ion doping concentration of the buffer layer 30 is negatively correlated with a thickness of the buffer layer 30, so that high resistance performance of the buffer layer 30 is prevented from being affected by doping, and leakage possibility is reduced.

In the embodiments of the present disclosure, the ion penetration capability of the second nucleation layer 22 is higher than the ion penetration capability of the first nucleation layer 21. In an embodiment, a material of the first nucleation layer 21 includes $Al_{a1}In_{b1}Ga_{1-a1-b1}N$, wherein 0≤a1≤1, 0≤b1≤1 and 0≤1−a1−b1≤1; and a material of the second nucleation layer 22 includes $Al_{a2}In_{b2}Ga_{1-a2-b2}N$, wherein 0≤a2≤1, 0≤b2≤1 and 0≤1−a2−b2≤1. Further, an Al component content of the second nucleation layer 22 is less than an Al component content of the first nucleation layer 21. The less the Al component content, the greater the In component content or Ga component content, the greater a lattice constant of the material of the second nucleation layer 22, and a lattice gap of the material of the second nucleation layer 22 is greater, so that the silicon ions in the substrate 10 may penetrate through the second nucleation layer 22 into the buffer layer 30, and the silicon ions in the substrate 10 may be prevented by the first nucleation layer 21 from penetrating into the buffer layer 30. In another embodiment, a thickness of the second nucleation layer 22 is less than a thickness of the first nucleation layer 21, so that the ion penetration capability of the second nucleation layer 22 is higher than the ion penetration capability of the first nucleation layer 21. For example, a thickness of the second nucleation layer 22 is less than 100 nm, which further benefits the silicon ions in the substrate 10 to penetrate through the second nucleation layer 22 into the buffer layer 30. In another embodiment, the Al component content of the second nucleation layer 22 is less than the Al component content of the first nucleation layer 21, and the thickness of the second nucleation layer 22 is less than the thickness of the first nucleation layer 21.

By designing the first nucleation layer 21 and the second nucleation layer 22 with different ion penetration capabilities, the silicon ions in the substrate 10 may diffuse into the buffer layer 30 through the second nucleation layer 22, so that the first buffer layer 31 and the second buffer layer 32 that are alternately arranged along a channel width direction are formed in the buffer layer 30, and a silicon concentration of the second buffer layer 32 is greater than a silicon concentration of the first buffer layer 31. Along the channel width direction, a doping concentration of the buffer layer 30 changes, and an influence on a concentration the two-dimensional electron gas is also changed, so that different threshold voltages may be formed at different positions of a channel layer, thereby improving the linearity of the device.

Figure 3:
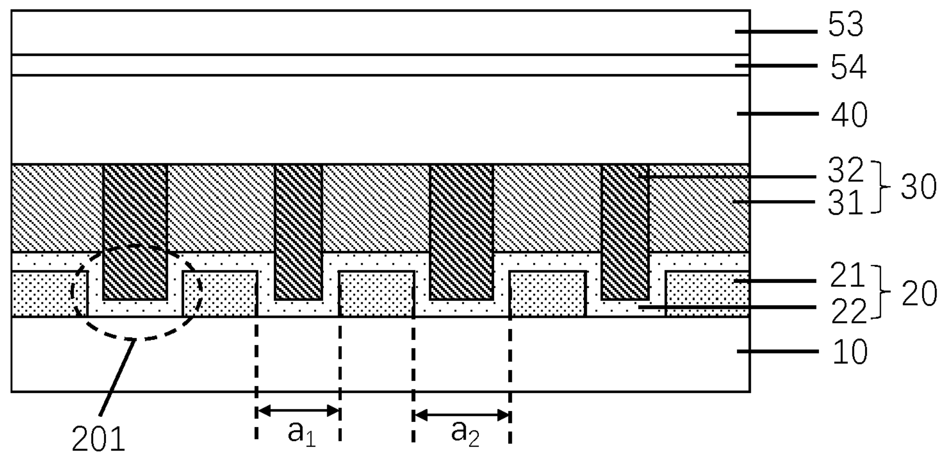
FIG. 3 and FIG. 4 are schematic structural diagrams of semiconductor structures according to some embodiments of the present disclosure.
Figure 4:
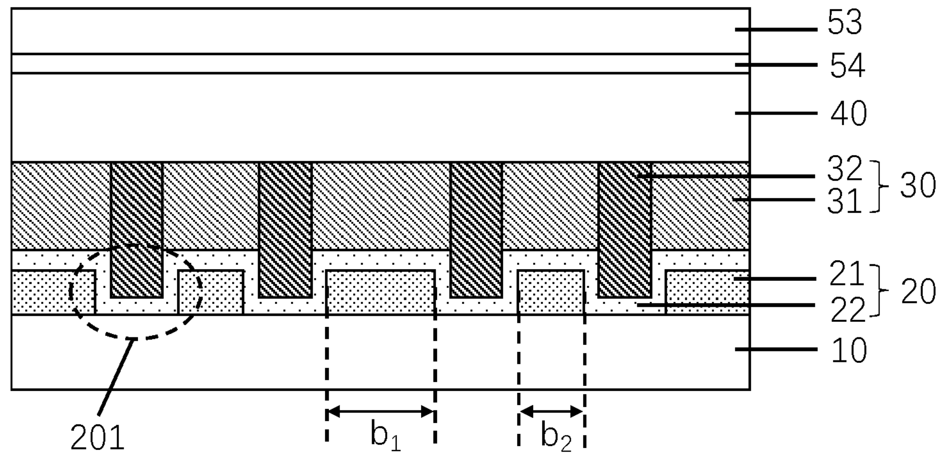

FIG. 3 and FIG. 4 are schematic structural diagrams of semiconductor structures according to some embodiments of the present disclosure. In an embodiment, at least two strip-shaped trenches 201 in the plurality of strip-shaped trenches 201 have different widths (a1, a2) (as shown in FIG. 3); and/or at least two strip-shaped trenches 201 in the plurality of strip-shaped trenches 201 have different spacing distances (b1, b2) (as shown in FIG. 4). The width or spacing distance of the strip-shaped trench 201 changes, that is, the width or spacing distance of the second buffer layer 32 corresponding to the strip-shaped trench 201 changes. By changing the widths or spacing distances of the strip-shaped trenches 201, transconductance peaks at different positions of the heterojunction structure layer 40 grown subsequently may be changed, and threshold voltages at different positions of the heterojunction structure layer 40 may be changed, so as to improve a linear working characteristic of the device.

Figure 5:
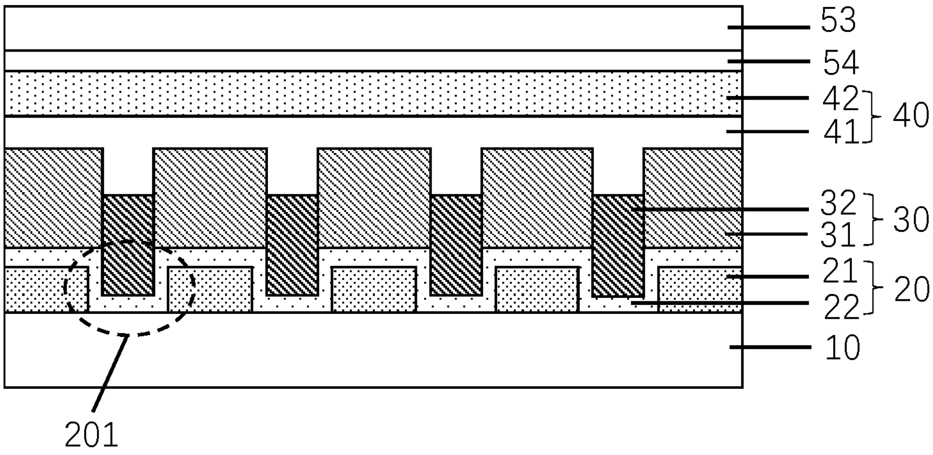
FIG. 5 to FIG. 7 are schematic structural diagrams of semiconductor structures according to some embodiments of the present disclosure.
Figure 6:
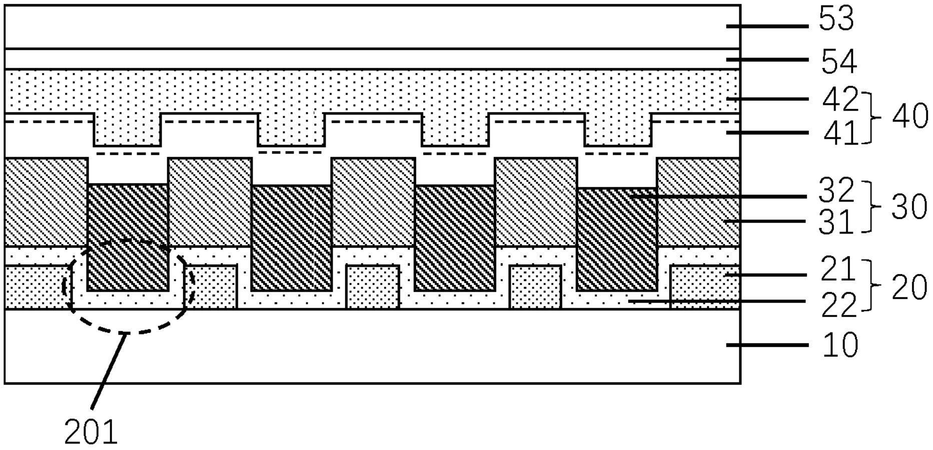
Figure 7:
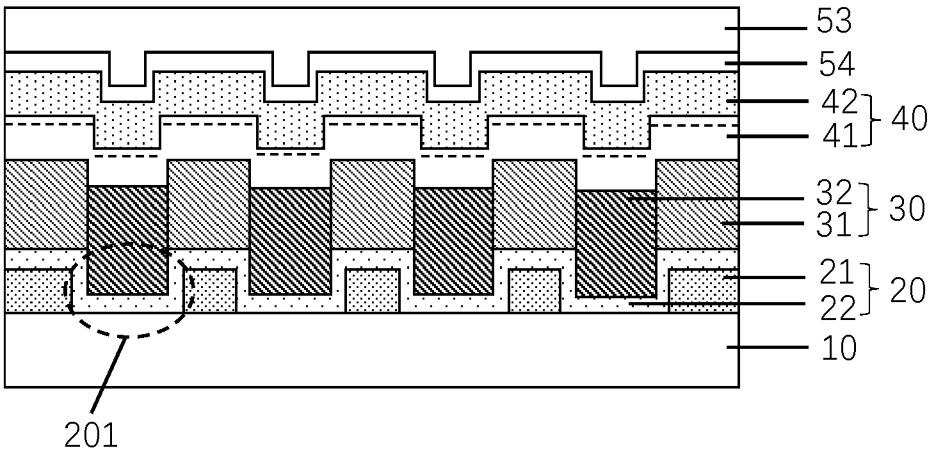

FIG. 5 to FIG. 7 are schematic structural diagrams of semiconductor structures according to some embodiments of the present disclosure. In an embodiment, a surface of a side, away from the substrate 10, of the buffer layer 30 is a plane (as shown in FIG. 2). In another embodiment, the buffer layer 30 is conformally disposed on the nucleation layer 20 (as shown in FIG. 5). The heterojunction structure layer 40 includes a channel layer 41 and a barrier layer 42. The channel layer 41 may be grown from a trench of the buffer layer 30 through lateral epitaxial technology, in this way, a dislocation density in the heterojunction structure layer 40 may be reduced greatly, and crystal quality of the heterojunction structure layer 40 is improved, thereby improving an electron mobility, a breakdown voltage, a leakage current and other characteristics of the device. In another embodiment, the buffer layer 30 is conformally disposed on the nucleation layer 20, and the channel layer 41 is further conformally disposed on the buffer layer 30 (as shown in FIG. 6), so that the two-dimensional electron gas generated by a heterojunction interface between the channel layer 41 and the barrier layer 42 is not in the same horizontal plane, so as to form a transverse multi-channel structure. Thus, mutual compensation of different transconductances of the device is facilitated, relative stability of the transconductance in a large gate-source bias voltage range is realized, the breakdown voltage is improved, dynamic characteristics are improved and the linearity of the device is further improved. In other embodiments, the barrier layer 42 is further conformally disposed on the channel layer 41 (as shown in FIG. 7), so that the two-dimensional electron gas generated by a heterojunction interface between the channel layer 41 and the barrier layer 42 is not in the same horizontal plane, and the trench in the barrier layer 42 is filled with the gate 53. In this way, in addition to achieving an effect of forming the transverse multi-channel structure, a control capability of the gate 53 on carriers is greatly improved, so that the breakdown voltage of the device may be greatly improved, a problem of the leakage may be relieved, and efficiency and the linearity of the device may be improved.

Figure 8:
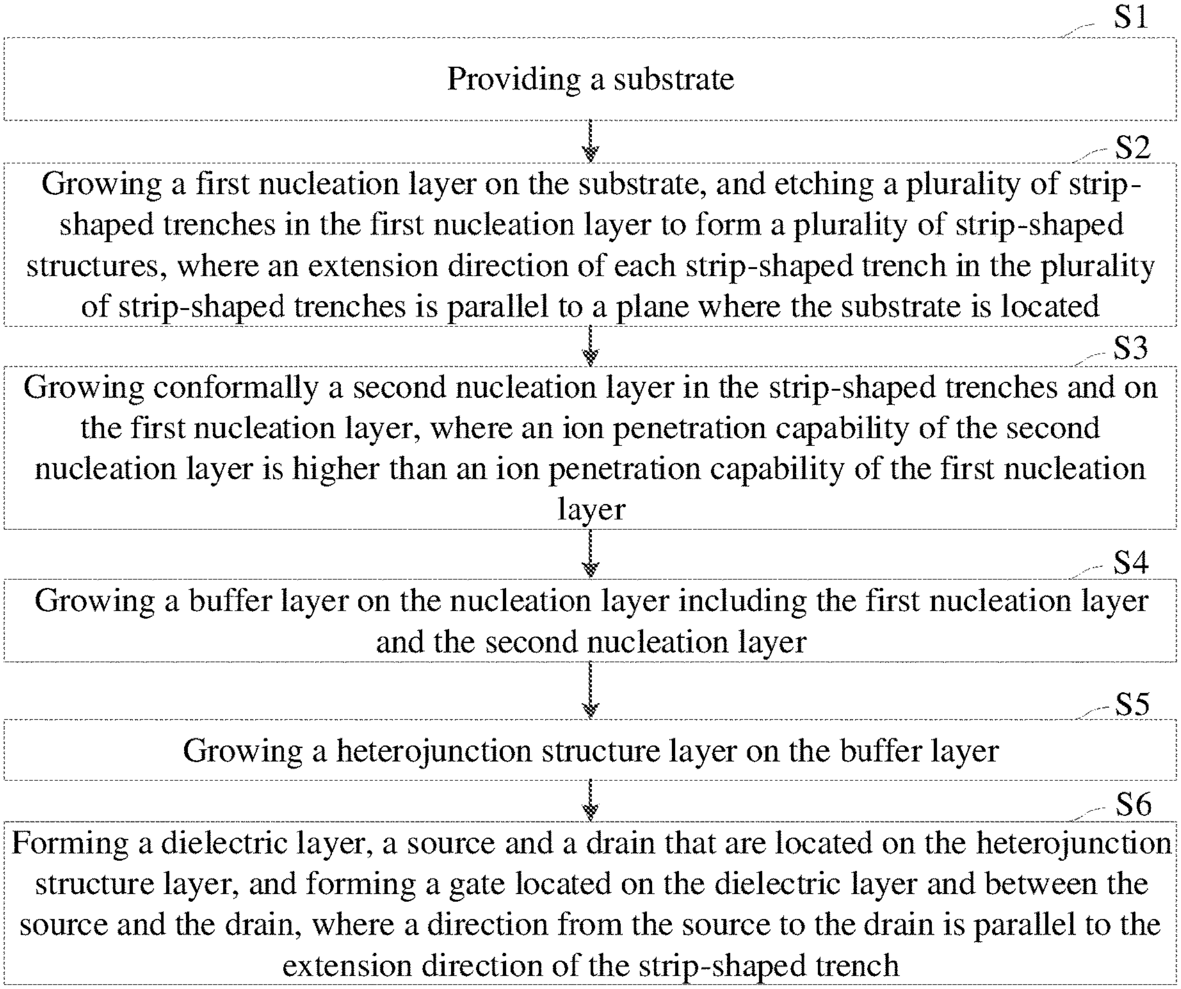
FIG. 8 is a schematic flowchart of a manufacturing method for a semiconductor structure according to an embodiment of the present disclosure.

According to another aspect of the present disclosure, a manufacturing method for a semiconductor structure is further provided. FIG. 8 is a schematic flowchart of a manufacturing method for a semiconductor structure according to an embodiment of the present disclosure. FIG. 9 to FIG. 17 are schematic structural diagrams of intermediate structures corresponding to a process for manufacturing a semiconductor structure according to an embodiment of the present disclosure. The manufacturing method for a semiconductor structure may be used for manufacturing the semiconductor structure of any one of the above embodiments, and therefore, some detailed description and related effects in the embodiments of the manufacturing method may be applied to the above embodiments of the semiconductor structure. Similarly, some detailed description and related effects in the above embodiments of the semiconductor structure may be applied to the embodiments of the manufacturing method. As shown in FIG. 8, a manufacturing method for a semiconductor structure provided by an embodiment of the present disclosure may include the following steps.

Figure 9:
FIG. 9 to FIG. 17 are schematic structural diagrams of intermediate structures corresponding to a process for manufacturing a semiconductor structure according to an embodiment of the present disclosure.

Step S1: providing a substrate. As shown in FIG. 9, the substrate 10 may include n-type ions. The n-type ions may be silicon ions or other ions. For example, the substrate 10 includes silicon ions, a material of the substrate 10 may include at least one of silicon and silicon carbide.

Step S2: growing a first nucleation layer on the substrate, and etching a plurality of strip-shaped trenches in the first nucleation layer to form a plurality of strip-shaped structures, where an extension direction of each strip-shaped trench in the plurality of strip-shaped trenches is parallel to a plane where the substrate is located.

Figure 10:
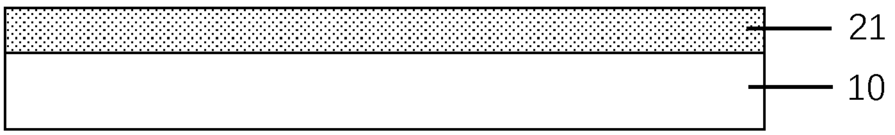
Figure 11:
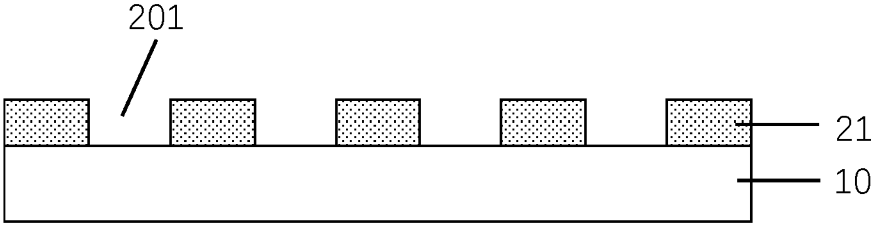

Specifically, as shown in FIG. 10, the first nucleation layer 21 is grown on the substrate 10. As shown in FIG. 11, the plurality of strip-shaped trenches 201 in the first nucleation layer 21 are etched to form the plurality of strip-shaped structures, and an extension direction of the strip-shaped trenches 201 is parallel to a plane where the substrate 10 is located.

Step S3: growing conformally a second nucleation layer in the strip-shaped trenches and on the first nucleation layer, where an ion penetration capability of the second nucleation layer is higher than an ion penetration capability of the first nucleation layer.

Figure 12:
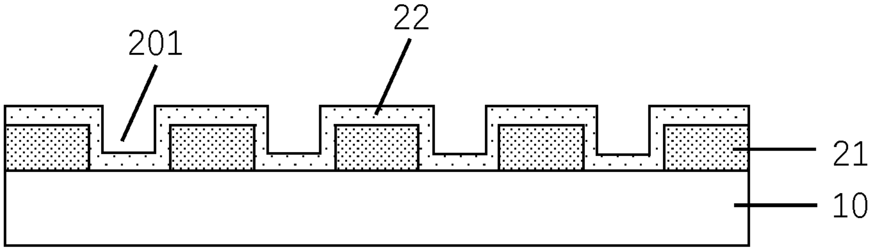

Specifically, as shown in FIG. 12, a second nucleation layer 22 is grown conformally in the strip-shaped trenches 201 and on the first nucleation layer 21, and an ion penetration capability of the second nucleation layer 22 is higher than an ion penetration capability of the first nucleation layer 21, so that the silicon ions in the substrate 10 may penetrate through the second nucleation layer 22 to diffuse into the buffer layer 30.

Step S4: growing a buffer layer on the nucleation layer including the first nucleation layer and the second nucleation layer.

Figure 13:
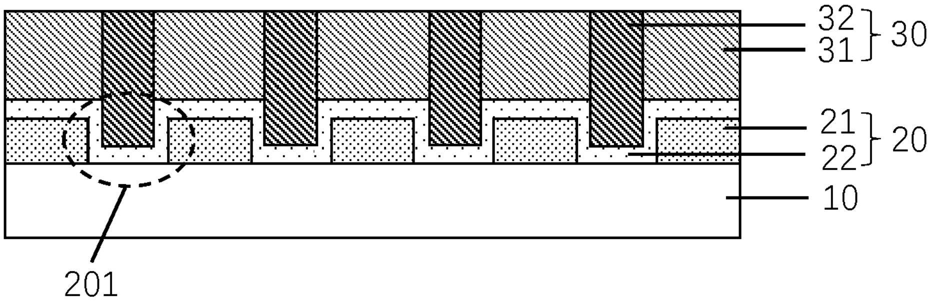

Specifically, as shown in FIG. 13, the buffer layer 30 is grown on the nucleation layer 20 including the first nucleation layer 21 and the second nucleation layer 22. After the buffer layer 30 is grown, an n-type ion in the substrate 10 disposed below the strip-shaped trenches 201 diffuses into the buffer layer 30 to form a second buffer layer 32 corresponding to the strip-shaped trenches 201 and to form a first buffer layer 31 corresponding to the first nucleation layer 21. A portion, located on the first nucleation layer 21, of the buffer layer 30 is the first buffer layer 31. An n-type ion doping concentration of the second buffer layer 32 is higher than an n-type ion doping concentration of the first buffer layer 31. The n-type ions for forming the second buffer layer 32 are silicon ions in the substrate 10.

Step S5: growing a heterojunction structure layer on the buffer layer.

Figure 14:
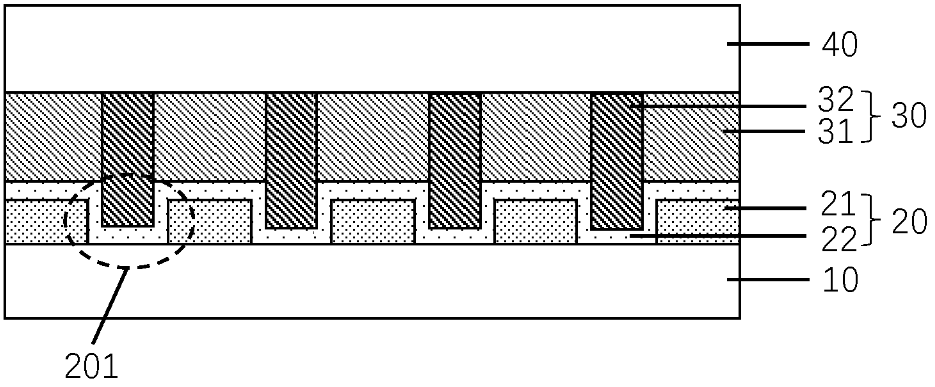

Specifically, as shown in FIG. 14, the heterojunction structure layer 40 is grown on the buffer layer 30.

Figure 15:
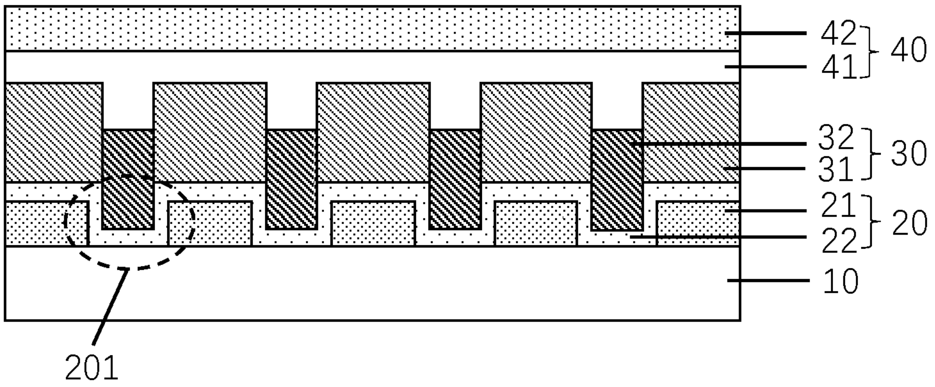
Figure 16:
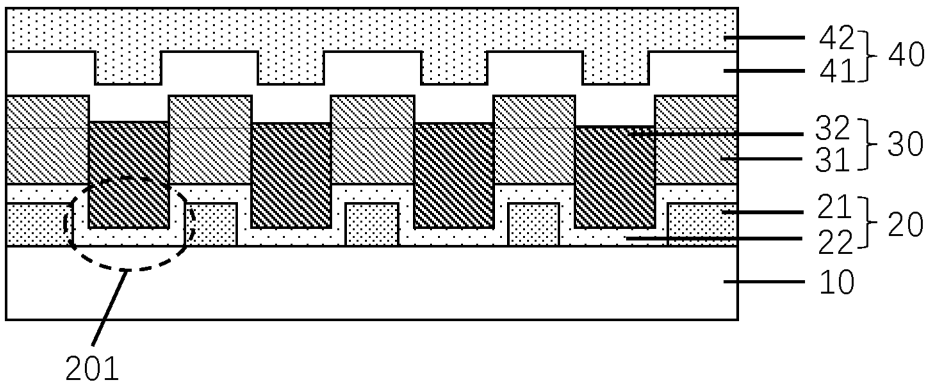
Figure 17:
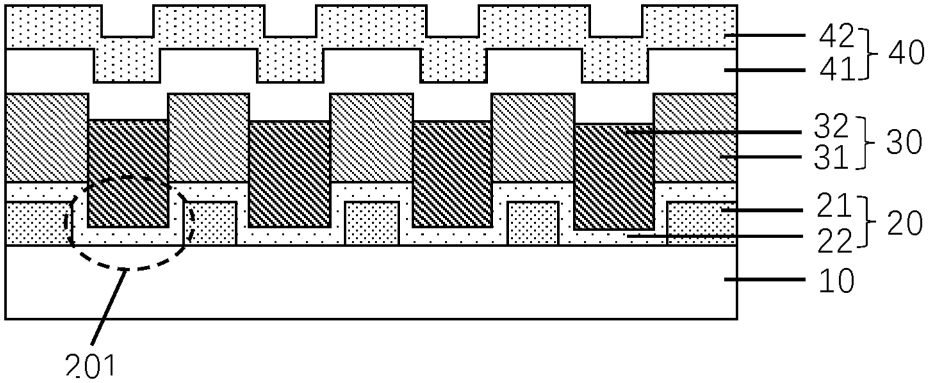

In an embodiment, surfaces of a side, away from the substrate 10, of the buffer layer 30 and the heterojunction structure layer 40 are planes, as shown in FIG. 14. In another embodiment, the buffer layer 30 may be conformally disposed on the nucleation layer 20, that is, the buffer layer 30 has trenches. The heterojunction structure layer 40 includes a channel layer 41 and a barrier layer 42, and the channel layer 41 may be grown from a trench of the buffer layer 30 through lateral epitaxial technology, as shown in FIG. 15. In another embodiment, the buffer layer 30 may be conformally disposed on the nucleation layer 20, that is, the buffer layer 30 has trenches. The channel layer 41 may be conformally disposed on the buffer layer 30, and the barrier layer 42 may be grown from a trench of the channel layer 41 through lateral epitaxial technology, as shown in FIG. 16. Further, the barrier layer 42 may also be conformally disposed on the channel layer 41, as shown in FIG. 17.

Further, the manufacturing method for the semiconductor structure may further include Step S6.

Step S6: forming a dielectric layer, a source and a drain that are located on the heterojunction structure layer, and forming a gate located on the dielectric layer and between the source and the drain, where a direction from the source to the drain is parallel to the extension direction of the strip-shaped trench.

Specifically, a dielectric layer 54, a source 51 and a drain 52 that are located on the heterojunction structure layer 40 are formed, a gate 53 located on the dielectric layer 54 and between the source 51 and the drain 52 is formed, and a direction from the source 51 to the drain 52 is parallel to an extension direction of the strip-shaped trenches 201, that is, the semiconductor structure shown in FIG. 1 is formed. A material of the dielectric layer 54 includes at least one of aluminum oxide, aluminum nitride and aluminum oxynitride. The material of the dielectric layer 54 has a strong ability to bind charges, and thus the charges are not easily polarized in a formed external electric field, and polarization charges are less, so that a polarization electric field is weak, thereby effectively avoiding a short-channel effect of the semiconductor structure. By disposing the dielectric layer 54, a Metal-Insulator-Semiconductor (MIS) gate structure is formed, which may effectively reduce a gate leakage current, and increase a gate voltage swing and a drain current swing, thereby further improving the performance of the device.

The present disclosure provides a semiconductor structure and a manufacturing method for the semiconductor structure, and the semiconductor structure includes a substrate, a nucleation layer, a buffer layer and a heterojunction structure layer that are stacked sequentially. The nucleation layer includes a first nucleation layer and a second nucleation layer. The first nucleation layer includes a plurality of strip-shaped structures, a strip-shaped trench is formed between two adjacent strip-shaped structures in the plurality of strip-shaped structures, and an extension direction of the strip-shaped trench is parallel to a plane where the substrate is located. The strip-shaped trench and the first nucleation layer are covered by the second nucleation layer, and an ion penetration capability of the second nucleation layer is higher than an ion penetration capability of the first nucleation layer. The first nucleation layer and the second nucleation layer with different ion penetration capacities are designed in the present disclosure to enable an n-type ion (such as a silicon ion) in the substrate to diffuse into the buffer layer through the second nucleation layer, so that a first buffer layer and a second buffer layer with different n-type ion concentrations are formed in the buffer layer. That is, the first buffer layer and the second buffer layer that are alternately arranged along a channel width direction are formed, and a silicon concentration of the second buffer layer is greater than a silicon concentration of the first buffer layer. The buffer layer of silicon-doped may release electrons, and an energy level of a semi-filled state formed by impurities and defects in the nucleation layer may capture the electrons, thereby reducing capture of device electrons, enhancing device performance and improving reliability of the device. Moreover, the buffer layer of silicon-doped may supplement carriers to improve a concentration of the two-dimensional electron gas and reduce a channel on-resistance. Along the channel width direction, a doping concentration of the buffer layer changes, and an influence on a concentration of the two-dimensional electron gas is also changed, so that different threshold voltages may be formed at different positions of a channel layer, thereby improving the linearity of the device.

It should be understood that the term “including” and its modification used in this disclosure are open-ended, that is, “including but not limited to”. The term “an embodiment” represents “at least one embodiment”; and the term “another embodiment" means "at least one another embodiment". In this specification, a schematic description of foregoing terms does not have to be directed to a same embodiment or example. Further, specific features, structures, materials, or features described may be incorporated in an appropriate manner in any one or more embodiments or examples. In addition, without being contradictory, a person skilled in the art may combine and permutate different embodiments or examples described in this specification and features of different embodiments or examples.

The foregoing descriptions are merely exemplary embodiments of the present disclosure, and are not intended to limit the present disclosure. Any modification, an equivalent replacement, or the like made within a spirit and principles of the present disclosure shall be included in a protection scope of the present disclosure.

What is claimed is:

1. A semiconductor structure, comprising:

a substrate, a nucleation layer, a buffer layer and a heterojunction structure layer that are stacked sequentially, wherein the nucleation layer comprises a first nucleation layer and a second nucleation layer, the first nucleation layer comprises a plurality of strip-shaped structures, a strip-shaped trench is formed between two adjacent strip-shaped structures in the plurality of strip-shaped structures, an extension direction of the strip-shaped trench is parallel to a plane where the substrate is located, the strip-shaped trench and the first nucleation layer are covered by the second nucleation layer, and an ion penetration capability of the second nucleation layer is higher than an ion penetration capability of the first nucleation layer.

2. The semiconductor structure according to claim 1, wherein a thickness of the second nucleation layer is less than a thickness of the first nucleation layer.

3. The semiconductor structure according to claim 1, wherein a thickness of the second nucleation layer is less than 100 nm.

4. The semiconductor structure according to claim 1, wherein a material of the first nucleation layer comprises $Al_{a1}In_{b1}Ga_{1-a1-b1}N$, wherein $0 \leq a1 \leq 1$, $0 \leq b1 \leq 1$ and $0 \leq 1-a1-b1 \leq 1$; and a material of the second nucleation layer comprises $Al_{a2}In_{b2}Ga_{1-a2-b2}N$, wherein $0 \leq a2 \leq 1$, $0 \leq b2 \leq 1$ and $0 \leq 1-a2-b2 \leq 1$.

5. The semiconductor structure according to claim 4, wherein an Al component content of the second nucleation layer is less than an Al component content of the first nucleation layer.

6. The semiconductor structure according to claim 1, wherein a plurality of strip-shaped trenches are formed in the first nucleation layer, and at least two strip-shaped trenches in the plurality of strip-shaped trenches have different widths, and/or at least two strip-shaped trenches in the plurality of strip-shaped trenches have different spacing distances.

7. The semiconductor structure according to claim 1, wherein the buffer layer comprises a first buffer layer and a second buffer layer, the first buffer layer is corresponding to the first nucleation layer, the second buffer layer is corresponding to the strip-shaped trench, and an n-type ion doping concentration of the second buffer layer is higher than an n-type ion doping concentration of the first buffer layer.

8. The semiconductor structure according to claim 7, wherein a surface of a side, away from the substrate, of the buffer layer is a plane.

9. The semiconductor structure according to claim 7, wherein the buffer layer is conformally disposed on the nucleation layer.

10. The semiconductor structure according to claim 9, wherein the heterojunction structure layer comprises a channel layer and a barrier layer, and the channel layer is conformally disposed on the buffer layer.

11. The semiconductor structure according to claim 10, wherein the barrier layer is conformally disposed on the channel layer.

12. The semiconductor structure according to claim 7, wherein an n-type ion doping concentration of the buffer layer is gradually decreased along a direction away from the substrate.

13. The semiconductor structure according to claim 7, wherein an n-type ion in the buffer layer is a silicon ion.

14. The semiconductor structure according to claim 1, wherein a material of the substrate comprises at least one of silicon and silicon carbide.

15. The semiconductor structure according to claim 1, further comprising:

a source and a drain, located on the heterojunction structure layer, wherein a direction from the source to the drain is parallel to the extension direction of the strip-shaped trench;

a gate, located on the heterojunction structure layer and between the source and the drain; and a dielectric layer, located on a side, close to the heterojunction structure layer, of the gate.

16. A manufacturing method for a semiconductor structure, comprising:

growing a first nucleation layer on a substrate, and etching a plurality of strip-shaped trenches in the first nucleation layer to form a plurality of strip-shaped structures, wherein an extension direction of each strip-shaped trench in the plurality of strip-shaped trenches is parallel to a plane where the substrate is located;

growing conformally a second nucleation layer in the strip-shaped trench and on the first nucleation layer, wherein an ion penetration capability of the second nucleation layer is higher than an ion penetration capability of the first nucleation layer;

growing a buffer layer on the nucleation layer comprising the first nucleation layer and the second nucleation layer; and growing a heterojunction structure layer on the buffer layer.

17. The manufacturing method for the semiconductor structure according to claim 16, wherein after the buffer layer is grown, an n-type ion in the substrate disposed below the strip-shaped trench diffuses into the buffer layer to form a second buffer layer corresponding to the strip-shaped trench and to form a first buffer layer corresponding to the first nucleation layer, and an n-type ion doping concentration of the second buffer layer is higher than an n-type ion doping concentration of the first buffer layer.

18. The manufacturing method for the semiconductor structure according to claim 17, wherein the n-type ion for forming the second buffer layer is a silicon ion.

19. The manufacturing method for the semiconductor structure according to claim 16, further comprising:

forming a dielectric layer, a source and a drain that are located on the heterojunction structure layer, and forming a gate located on the dielectric layer and between the source and the drain, wherein a direction from the source to the drain is parallel to the extension direction of the strip-shaped trench.

20. The manufacturing method for the semiconductor structure according to claim 16, wherein a thickness of the second nucleation layer is less than a thickness of the first nucleation layer.

* * * * *